(12) United States Patent
Howard et al.

(10) Patent No.: US 7,334,172 B2
(45) Date of Patent: Feb. 19, 2008

(54) TRANSITION FAULT DETECTION REGISTER WITH EXTENDED SHIFT MODE

(75) Inventors: Michael Howard, San Jose, CA (US); Milind Sonawane, Sunnyvale, CA (US); Jonjen Sern, Milpitas, CA (US); Vicky Wu, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 148 days.

(21) Appl. No.: 10/969,086

(22) Filed: Oct. 20, 2004

(65) Prior Publication Data

US 2006/0085708 A1 Apr. 20, 2006

(51) Int. Cl.
*G01R 31/28* (2006.01)
(52) U.S. Cl. ...................................... 714/726
(58) Field of Classification Search ................ 714/729, 714/726–728
See application file for complete search history.

(56) References Cited

U.S. PATENT DOCUMENTS 5,719,878 A * 2/1998 Yu et al. ..................... 714/726
6,442,722 B1 * 8/2002 Nadeau-Dostie et al. ... 714/731
2002/0120896 A1 * 8/2002 Wang et al. ................. 714/731
2002/0162064 A1 * 10/2002 Shimizu ..................... 714/726
2003/0084390 A1 * 5/2003 Tamarapalli et al. ........ 714/744
2005/0055615 A1 * 3/2005 Agashe et al. .............. 714/727
2005/0066242 A1 * 3/2005 Wang et al. ................. 714/700
2005/0235186 A1 * 10/2005 Wang et al. ................. 714/728

\* cited by examiner

*Primary Examiner*—Cynthia Britt
(74) *Attorney, Agent, or Firm*—Eric James Whitesell

(57) ABSTRACT

An apparatus includes a register of an integrated circuit for shifting a scan test pattern in response to a scan enable signal. The register includes: a shift input for receiving the scan test pattern; a system logic input for receiving a system logic signal; a clock input for receiving a next clock pulse; a scan enable input for switching the register between a shift mode and a normal mode; a register output for latching the shift input in the shift mode or the system logic input in the normal mode in response to the next clock pulse; and a scan enable gating circuit coupled to the scan enable input for holding the register in the shift mode while the scan enable signal is in the shift mode and immediately following a transition of the scan enable signal from the shift mode to the normal mode until after the register output has latched the shift input in response to the next clock pulse following the transition of the scan enable signal to the normal mode.

14 Claims, 4 Drawing Sheets

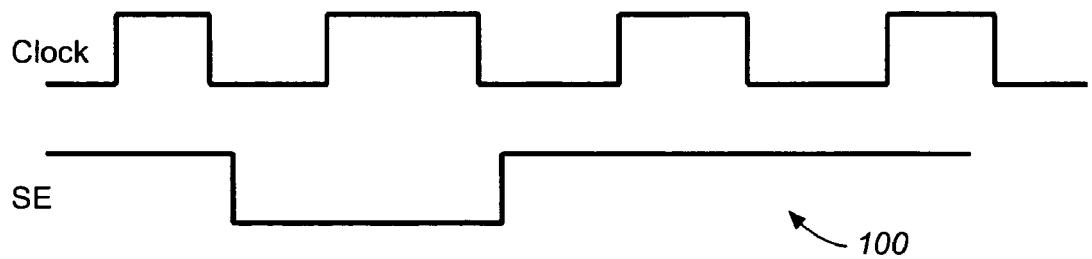
FIG._1
(PRIOR ART)
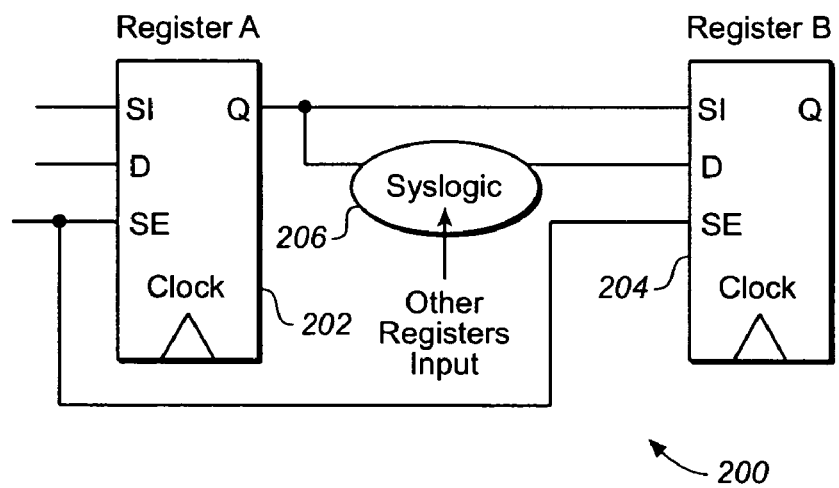
FIG._2
(PRIOR ART)

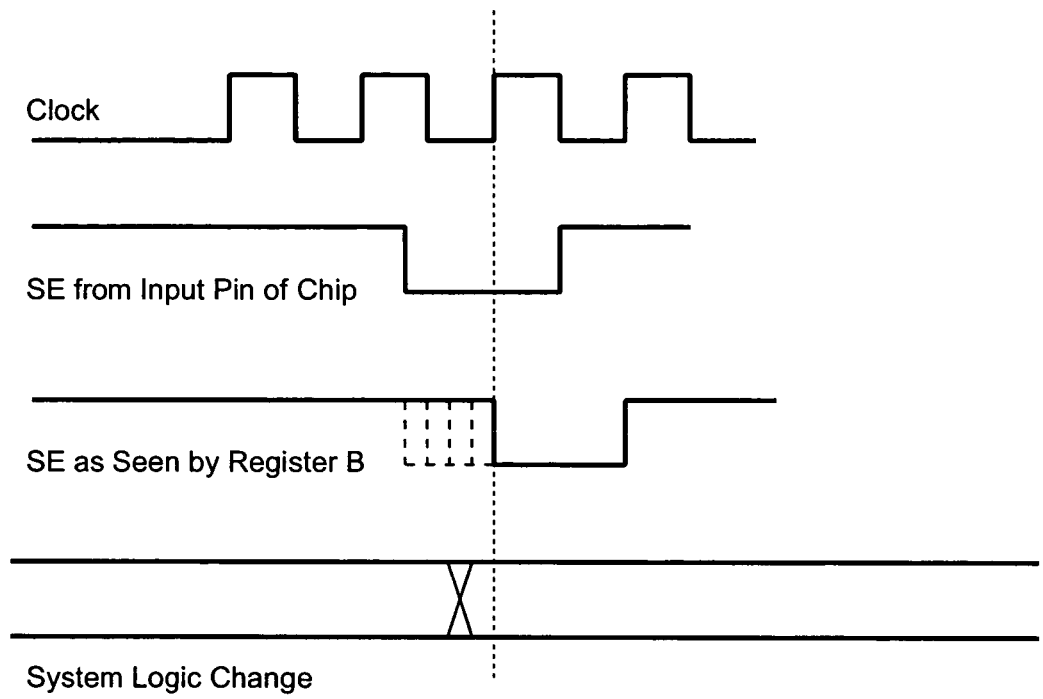
FIG._3
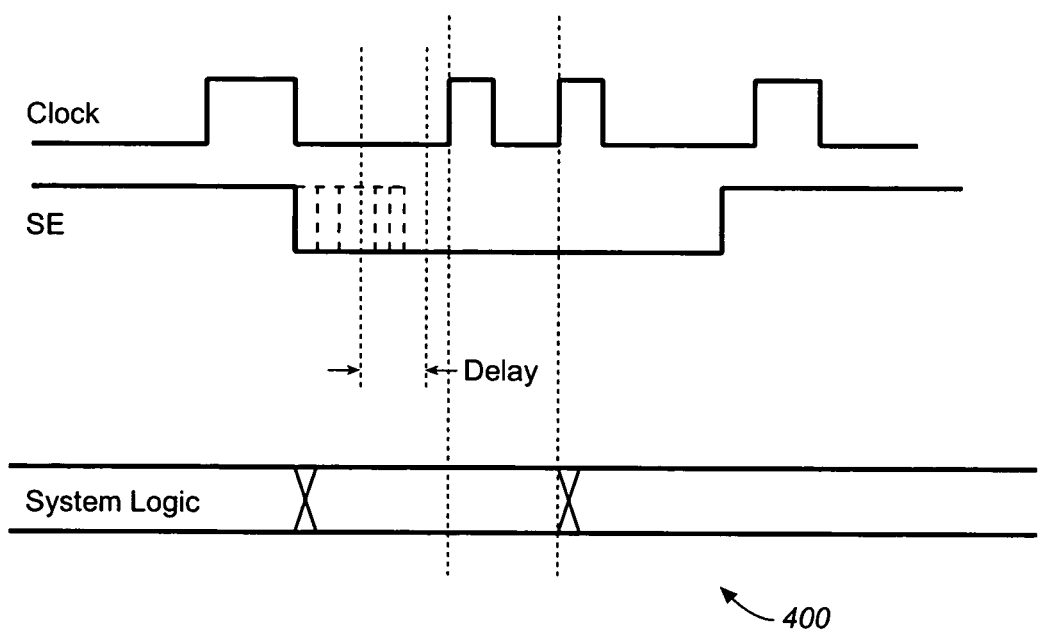
FIG._4

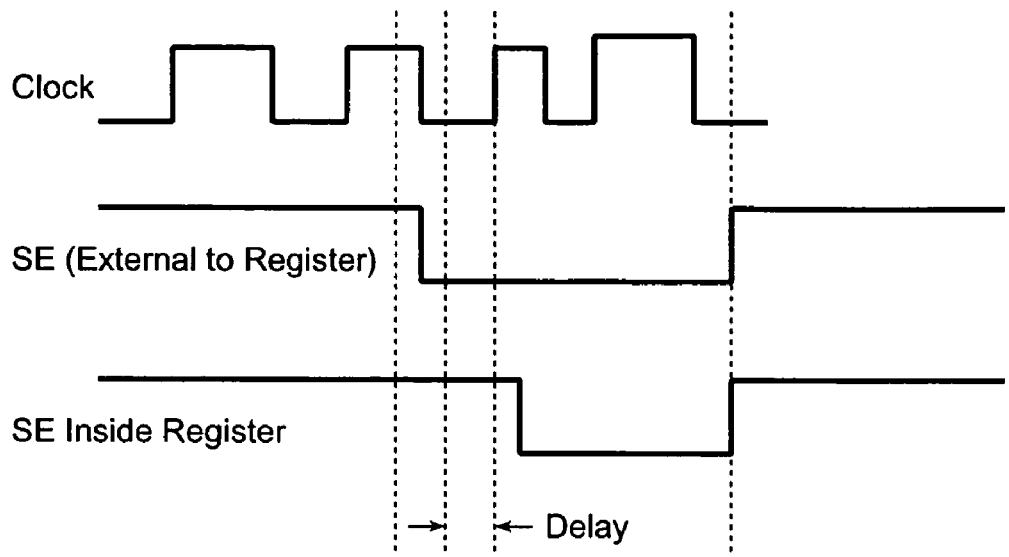
FIG._5
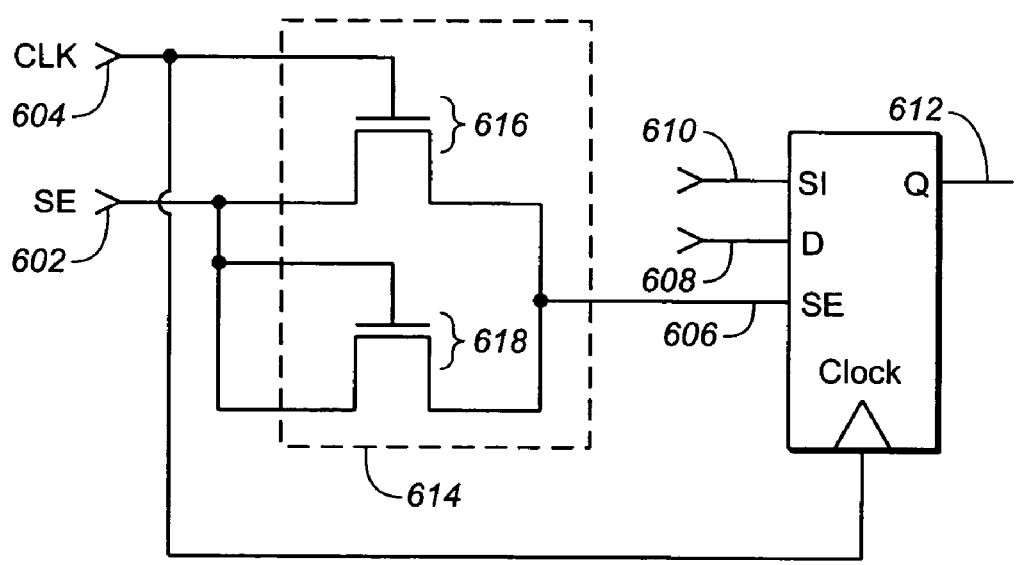
FIG._6

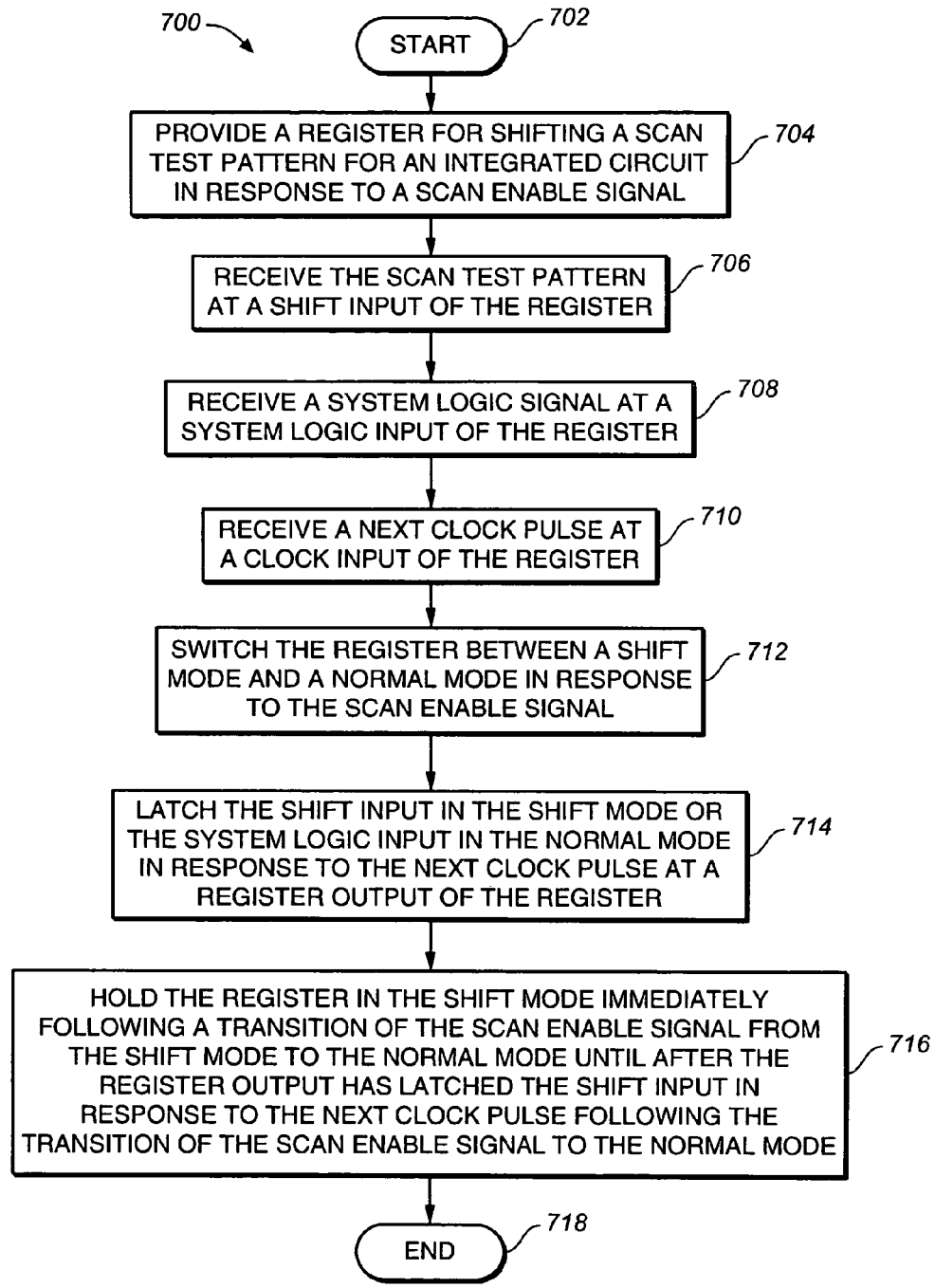
FIG._7

TRANSITION FAULT DETECTION REGISTER WITH EXTENDED SHIFT MODE

BACKGROUND OF THE INVENTION

1. Field of the Invention

The present invention relates generally to the design and testing of integrated circuits. More specifically, but without limitation thereto, the present invention relates to the design and testing of logic for detecting transition delay faults in an integrated circuit.

2. Description of Related Art

Early methods for testing integrated circuits were designed to detect stuck-at faults, which may be detected using only a single value at each register of an integrated circuit design. As integrated circuits became larger and more difficult to test, delay fault testing was introduced to detect slow to rise or slow to fall time at a gate input. Detection of delay faults, also called transition delay faults, require two test patterns to be applied to each register.

Integrated circuits (ICs) are susceptible to manufacturing defects that may cause the IC to malfunction, called faults. Two important categories of fault models are single stuck-at faults (SAF) and transition delay faults (TDF). Stuck-at faults occur when a signal inside the ASIC that was designed to transition between two logic states (0 and 1) remains in one state due to a chip manufacturing defect. A transition delay fault occurs when a signal transitions too late or too slow for proper operation due to, for example, excessive net capacitance. Stuck-at faults may be detected using only a single value at each register of an integrated circuit design, while transition delay faults require two test patterns to be applied to each register.

To determine whether an IC has a fault, the IC is typically tested using automated test equipment (ATE) to detect and reject defective parts before shipment to a customer. The number of faults that may be detected by ATE using a test devised by the manufacturer is typically expressed as a percentage of the total number of possible faults and is called the fault coverage of the test. A high value of fault coverage is desirable to avoid the costs associated with delivering defective parts.

SUMMARY OF THE INVENTION

In one embodiment, a register of an integrated circuit for shifting a scan test pattern in response to a scan enable signal includes:
a shift input for receiving the scan test pattern;
a system logic input for receiving a system logic signal;
a clock input for receiving a next clock pulse;
a scan enable input for switching the register between a shift mode and a normal mode;
a register output for latching the shift input in the shift mode or the system logic input in the normal mode in response to the next clock pulse; and
a scan enable gating circuit coupled to the scan enable input for holding the register in the shift mode while the scan enable signal is in the shift mode and immediately following a transition of the scan enable signal from the shift mode to the normal mode until after the register output has latched the shift input in response to the next clock pulse following the transition of the scan enable signal to the normal mode.

In another embodiment, a method includes steps of:
(a) providing a register of an integrated circuit for shifting a scan test pattern in response to a scan enable signal;
(b) receiving the scan test pattern at a shift input of the register;
(c) receiving a system logic signal at a system logic input of the register;
(d) receiving a next clock pulse at a clock input of the register;
(e) switching the register between a shift mode and a normal mode in response to the scan enable signal;
(f) latching the shift input in the shift mode or the system logic input in the normal mode in response to the next clock pulse at a register output of the register; and
(g) holding the register in the shift mode immediately following a transition of the scan enable signal from the shift mode to the normal mode until after the register output has latched the shift input in response to the next clock pulse following the transition of the scan enable signal to the normal mode.

BRIEF DESCRIPTION OF THE DRAWINGS

The embodiments described herein are illustrated by way of example and not limitation in the accompanying figures, in which like references indicate similar elements throughout the several views of the drawings, and in which:

FIG. 1 illustrates a timing diagram for a last-shift method of fault detection according to the prior art;

FIG. 2 illustrates a schematic of a scan chain used with the method of FIG. 1;

FIG. 3 illustrates a timing diagram for the method of FIG. 1 with timing uncertainty of the scan enable signal;

FIG. 4 illustrates a timing diagram of a two-clock capture method of fault detection that avoids the timing uncertainty of the scan enable signal in FIG. 3;

FIG. 5 illustrates a timing diagram of last-shift method of fault detection with an extended scan enable signal;

FIG. 6 illustrates a schematic of a transition fault detection register according to the method of FIG. 5; and FIG. 7 illustrates a flow chart for implementing the method of FIG. 5.

Elements in the figures are illustrated for simplicity and clarity and have not necessarily been drawn to scale. For example, the dimensions of some elements in the figures may be exaggerated relative to other elements to point out distinctive features in the illustrated embodiments.

To simplify referencing in the description of the illustrated embodiments of the present invention, indicia in the figures may be used interchangeably to identify both the signals that are communicated between the elements and the connections that carry the signals. For example, an address communicated on an address bus may be referenced by the same number used to identify the address bus.

DESCRIPTION OF THE ILLUSTRATED EMBODIMENTS

To facilitate testing of integrated circuits using automated test equipment (ATE), test logic is generally included in the integrated circuit itself. The test logic usually functions only during testing and has no utility during normal operation of the integrated circuit in the field.

In the scan method, all the flip-flop elements in the ASIC design are connected in large scan chains. During scan test, test patterns are shifted through the scan chains to initialize the flip-flop elements to a predetermined state. The output data from the logic elements connected to the flip-flop elements is captured by other flip-flop elements that are also part of the scan chains. The captured data is then shifted out.

The ATE controls the shifting and capture phases and transmits the test patterns to the ASIC. The same clock signal is used during the shift and capture phases, and a scan enable signal is used to control when shifting occurs and when data is captured. The ATE also receives the captured data when it is shifted out and compares the captured data to expected results. This method of testing is called launch off shift because the logic under test begins to transition to the state that is captured immediately after the final shift. Launch off shift is not normally used for high speed testing because the scan enable signal design typically results in slow ramptimes without taking into consideration propagation delay of the scan enable signal through the ASIC.

In the launch off capture method, the capture phase is extended by a second clock pulse. During the shift phase, a test pattern is scanned into upstream flip-flops that drive control flip-flops that drive the logic under test (LUT). The first capture clock pulse is used to load the test output values from the control flip-flops into the logic under test (LUT). The second capture clock pulse is used to load the test output values from the logic under test into observation flip-flops. The upstream flip-flops for one group of logic under test may and likely will also be control or observation flip-flops for another group of logic under test. This method is called launch off capture because the logic under test begins to transition to the final capture state immediately after the first clock pulse of the capture phase. The timing between the first and second capture clock pulses determines the speed of the test, therefore the speed of the test does not depend on the timing of the scan test signal.

Software tools such as Fastscan from Mentor Graphics are commercially available to automatically calculate the test patterns that are shifted into the upstream logic to achieve a selected state of the control flip-flops after the initial capture clock pulse. Transition delay fault detection requires two test patterns, one for a slow-to-rise fault and one for a slow-to-fall fault. One commonly used method to detect transition delay faults is the last-shift method.

FIG. 1 illustrates a timing diagram 100 for a last-shift method of fault detection according to the prior art. In FIG. 1, the clock signal is used to latch either a test signal at a shift input of a register in the shift mode or a system logic signal at a "D" input of the register in the normal mode. The scan enable signal is used to switch the registers in the scan chain between the shift mode and the normal mode.

FIG. 2 illustrates a schematic 200 of a scan chain used with the method of FIG. 1. Shown in FIG. 2 are a register "A" 202, a register "B" 204, and system logic 206.

In FIG. 2, the scan enable (SE) inputs of the registers 202 and 204 are used to select the shift input (SI) in the shift mode or the "D" input in the normal mode. The shift inputs of the registers 202 and 204 are "stitched", that is, connected in series to form a scan chain. In the shift mode, the scan test vector is latched into the register 202 and passed from the "Q" output to the shift input of the register 204. In the shift mode, the system logic 206 is bypassed, so that only the scan test vector is shifted through the scan chain. In this example, only two registers are used to illustrate a scan chain, however, a typical scan chain may include thousands of registers.

When the scan test vector has been loaded into all of the registers in the scan chain, the scan enable signal transitions to the normal mode, so that the registers 202 and 204 latch the system logic signal 206 at the "D" inputs in response to the next clock pulse. The scan enable signal transitions back to the shift mode, and the signal just "captured" or latched into the registers 202 and 204 from the system logic 206 is shifted out through the shift input for test comparison.

By reducing the period of the clock signal until the test fails, the maximum speed of the circuit may be measured. To accurately test the system logic using this method, the scan enable signal must be faster than the system logic, otherwise the registers in the scan chain will capture the signal on the shift input instead of the "D" input before the scan enable signal transitions to the normal mode.

FIG. 3 illustrates a timing diagram 300 for the method of FIG. 1 with timing uncertainty of the scan enable signal. In FIG. 3, the scan enable signal received by a register has a variable delay relative to the scan enable pin on the chip. In this example, the scan enable signal received at register 204 is still in the shift mode when the next clock pulse is received, resulting in a false read from the shift input instead of the "D" input. Consequently, the maximum speed of the scan enable test signal is measured instead of the maximum speed of the system logic. A solution to this problem is to use two clock pulses after the scan enable signal transitions to the normal mode and to adjust the edges of the clock signal so that the device speed may be measured without interference from the scan enable signal.

FIG. 4 illustrates a timing diagram 400 of a two-clock capture method of fault detection that avoids the timing uncertainty of the scan enable signal in FIG. 3. In FIG. 4, the clock pulses are delayed when the scan enable signal transitions to the normal mode to ensure that the scan enable signal has settled to the normal mode. The succeeding clock pulses then latch the system logic signal at the "D" input, avoiding the possibility of latching the shift input.

A problem with the method of FIG. 4 is that the scan test vector must be generated from the system logic instead of the test logic, which may be impractical. As a result, lower fault coverage is achieved than that of the method of FIG. 3.

FIG. 5 illustrates a timing diagram 500 of a last-shift method of fault detection with an extended scan enable signal. In FIG. 5, the scan enable signal is extended internally by the register so that the register is held in the shift mode when the scan enable signal transitions from the shift mode to the normal mode until the shift input is latched on the next clock pulse immediately following the transition of the scan enable signal to the normal mode. The register is then switched to the normal mode so that the "D" input is latched on the second clock pulse immediately following the transition of the scan enable signal. When the scan enable signal transitions from the normal mode to the shift mode, however, the register is switched to the shift mode immediately.

In other words, the register is switched to the shift mode immediately following each transition of the scan enable signal to the shift mode and to the normal mode immediately following the second clock pulse immediately following the transition of the scan enable signal to the normal mode. Both of these functions may be accomplished, for example, by only the two transistors 616 and 618 in FIG. 6.

By extending the shift mode inside the register for an extra clock cycle, the data may be shifted in all registers, thereby achieving the higher fault coverage available from the last-shift method. Also, the data captured from the pattern may be shifted out and observed immediately due to the immediate switching from the normal mode to the shift mode in response to the scan enable signal.

FIG. 6 illustrates a schematic 600 of a transition fault detection register according to the method of FIG. 5. Shown in FIG. 6 are a scan enable input 602, a clock input 604, a gated scan enable input 606, a "D" input 608, a shift input 610, a "Q" output 612, a scan enable gating circuit 614, and pass transistors 616 and 618.

In FIG. 6, the scan enable gating circuit 614 is incorporated into the transition fault detection register to provide the extended scan enable illustrated in FIG. 5. In this example of the scan enable gating circuit 614, the gated scan enable input 606 is driven to the shift mode when the scan enable input 602 is in the shift mode by the pass transistor 618. When the next clock pulse transitions to the same logic level as the shift mode, the gated scan enable input 606 remains at the shift mode level. When the clock pulse and the scan enable 602 have both transitioned to the normal mode logic level, the pass transistors 616 and 618 are cut off, trapping the shift mode logic level at the gated scan enable input 606. Trapping the shift mode logic level at the gated scan enable input 606 extends the scan enable signal at the gated scan enable input 606, ensuring that the shift input 610 is latched at the "Q" output 612 at the next clock pulse immediately following the transition of the scan enable signal to the normal mode.

The next clock pulse at the pass transistor 616 immediately following the latching of the shift input 610 gates the normal mode logic level to the gated scan enable input 606, so that the "D" input is latched at the "Q" output 612. The gated scan enable input 606 is driven to the shift mode again by the pass transistor 618 when the scan enable input 602 transitions to the shift mode, regardless of the logic level of the clock pulse at the pass transistor 616.

Other gating circuits may be used to generate the extended scan enable signal illustrated in FIG. 5 according to well known techniques of circuit design. Preferably, a minimum number of components is used for the scan enable gating circuit 614 to minimize cost and chip area.

FIG. 7 illustrates a flow chart for implementing the method of FIG. 5.

Step 702 is the entry point of the flow chart 700.

In step 704, a register is provided for shifting a scan test pattern for an integrated circuit in response to a scan enable signal according to well known techniques.

In step 706, the scan test pattern is received at a shift input of the register.

In step 708, a system logic signal is received at a system logic input of the register.

In step 710, a next clock pulse is received at a clock input of the register.

In step 712, the register is switched between a shift mode and a normal mode in response to the scan enable signal.

In step 714, the shift input is latched in the shift mode or the system logic input is latched in the normal mode in response to the next clock pulse at a register output of the register.

In step 716, the register is held in the shift mode immediately following a transition of the scan enable signal from the shift mode to the normal mode until after the register output has latched the shift input in response to the next clock pulse following the transition of the scan enable signal to the normal mode.

Step 718 is the exit point of the flow chart 700.

Although the flowchart descriptions above are described and shown with reference to specific steps performed in a specific order, these steps may be combined, sub-divided, or reordered without departing from the scope of the claims. Unless specifically indicated herein, the order and grouping of steps is not a limitation of other embodiments within the scope of the claims.

The specific embodiments and applications thereof described above are for illustrative purposes only and do not preclude modifications and variations that may be made thereto by those skilled in the art within the scope of the following claims.

What is claimed is:

1. An apparatus comprising:
   a register for an integrated circuit for shifting a scan test pattern in response to a scan enable signal, the register comprising:
   a shift input for receiving the scan test pattern;
   a system logic input for receiving a system logic signal;
   a clock input for receiving clock pulses;
   a scan enable input for switching the register between a shift mode and a normal mode;
   a register output for latching the shift input in the shift mode or the system logic input in the normal mode in response to a clock pulse; and
   a scan enable gating circuit coupled to the scan enable input comprising first means for gating the scan enable signal to the scan enable input immediately following a transition of the scan enable signal from the normal mode to the shift mode and second means for gating the scan enable signal to the scan enable input immediately following a second one of the clock pulses immediately following a transition of the scan enable signal from the shift mode to the normal mode.

2. The apparatus of claim 1, the first means comprising only one transistor to gate the scan enable signal to the scan enable input in response to the scan enable signal.

3. The apparatus of claim 2, the transistor being cut off when the scan enable signal transitions from the shift mode to the normal mode to trap the scan enable input in the shift mode.

4. The apparatus of claim 1, the second means comprising only one transistor to gate the scan enable signal to the scan enable input in response to the second one of the clock pulses.

5. The apparatus of claim 1, the first means comprising only one transistor.

6. The apparatus of claim 1, the second means comprising only one transistor.

7. The apparatus of claim 1, the first means comprising only one transistor and the second means comprising only one transistor.

8. A method comprising steps of:
   (a) providing a register for shifting a scan test pattern for an integrated circuit in response to a scan enable signal;
   (b) receiving the scan test pattern at a shift input of the register;
   (c) receiving a system logic signal at a system logic input of the register;
   (d) receiving clock pulses at a clock input of the register;
   (e) latching the shift input in the shift mode or the system logic input in the normal mode at a register output of the register in response to a clock pulse;
   (f) switching the register from the normal mode to the shift mode immediately following a transition of the scan enable signal from the normal mode to the shift mode; and
   (g) switching the register from the shift mode to the normal mode immediately following a second one of the clock pulses immediately following a transition of the scan enable signal from the shift mode to the normal mode.

9. The method of claim 8, step (g) comprising gating the scan enable signal to a scan enable input of the register immediately following the second one of the clock pulses.

10. The method of claim 8, step (f) comprising gating the scan enable signal to a scan enable input of the register in response to the scan enable signal.

11. An apparatus comprising:
   a register for an integrated circuit for shifting a scan test pattern in response to a scan enable signal, the register comprising:
   a shift input for receiving the scan test pattern;
   a system logic input for receiving a system logic signal;
   a clock input for receiving clock pulses;
   a scan enable input for switching the register between a shift mode and a normal mode;
   a register output for latching the shift input in the shift mode or the system logic input in the normal mode in response to a clock pulse; and
   a scan enable gating circuit coupled to the scan enable input comprising only one first transistor for gating the scan enable signal to the scan enable input immediately following a transition of the scan enable signal from the normal mode to the shift mode and only one second transistor for gating the scan enable signal to the scan enable input immediately following a second one of the clock pulses immediately following a transition of the scan enable signal from the shift mode to the normal mode.

12. The apparatus of claim 11 further comprising the source and drain of the first transistor connected in series with the scan enable signal and the scan enable input to trap the scan enable input in the shift mode when the scan enable signal transitions from the shift mode to the normal mode.

13. A scan enable gating circuit comprising only one first transistor and only one second transistor,
   the first transistor coupling a scan enable signal to a scan enable input of a register to switch the register from the normal mode to the shift mode immediately following a transition of the scan enable signal from the normal mode to the shift mode, and
   the second transistor coupling the scan enable signal to the scan enable input to switch the register from the shift mode to the normal mode immediately following a second clock pulse immediately following a transition of the scan enable signal from the shift mode to the normal mode.

14. The apparatus of claim 13 further comprising the source and drain of the first transistor connected in series with the scan enable signal and the scan enable input to trap the scan enable input in the shift mode when the scan enable signal transitions from the shift mode to the normal mode.

* * * * *